US012575072B2

(12) United States Patent
Suzuki et al.

(10) Patent No.: US 12,575,072 B2
(45) Date of Patent: Mar. 10, 2026

(54) COOLER AND SEMICONDUCTOR APPARATUS

(71) Applicant: FUJI ELECTRIC CO., LTD., Kawasaki (JP)

(72) Inventors: Yuji Suzuki, Hino (JP); Yasutaka Sanuki, Sagamihara (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 159 days.

(21) Appl. No.: 18/070,971

(22) Filed: Nov. 29, 2022

(65) Prior Publication Data

US 2023/0232599 A1     Jul. 20, 2023

(30) Foreign Application Priority Data

Jan. 19, 2022     (JP) ................................. 2022-006342

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC ........... H05K 7/20927; H05K 7/20254; H05K 7/20272; H05K 7/20; H05K 7/209; H05K 7/1432; H05K 7/20263; H05K 7/2089; H05K 7/20872; H05K 1/0203; H05K 7/20218; H05K 7/2039; H05K 7/20936; H05K 7/14322; H05K 2201/064;

(Continued)

(56) References Cited

U.S. PATENT DOCUMENTS 5,978,220 A * 11/1999 Frey .......................... F28F 3/12
361/677
9,237,676 B2 * 1/2016 Gohara .............. H05K 7/20254

(Continued)

FOREIGN PATENT DOCUMENTS

JP      2008-172024 A      7/2008
JP      2008-294068 A     12/2008

(Continued)

OTHER PUBLICATIONS

Yoshida Tadashi; JP2012129280; Semiconductor Cooling device and manufacturing method of the same; PE2E search NPL (Year: 2012).*

(Continued)

*Primary Examiner* — Michael A Matey

(57)     ABSTRACT

A cooler includes a main body extending in the Y direction. The main body includes: (i) an outer wall including an outer surface on which a semiconductor module is to be arranged, and an inner surface; (ii) an inflow path extending in the Y direction, and having an end into which a refrigerant flows; (iii) an outflow path extending in the Y direction, and having an end from which the refrigerant flows out; and (iv) cooling flow paths having the inner surface as a part of a wall surface. The cooling flow paths are arrayed in the Y direction, extend in the X direction, and are positioned between the inflow and outflow paths and the outer wall in the Z direction. Each of the cooling flow paths causes the inflow path and the outflow path to communicate with each other in the X direction.

7 Claims, 8 Drawing Sheets

(58) Field of Classification Search
CPC . H01L 23/473; H01L 23/367; H01L 23/3672; H01L 23/40; H01L 2924/13055
See application file for complete search history.

(56) References Cited

U.S. PATENT DOCUMENTS

| | | | | |
|---|---|---|---|---|
| 9,472,488 | B2 * | 10/2016 | Gohara | F28F 3/00 |
| 10,014,236 | B2 * | 7/2018 | Adachi | H01L 23/3675 |
| 10,950,522 | B2 * | 3/2021 | Yuguchi | H05K 7/20927 |
| 11,183,901 | B2 * | 11/2021 | Zhou | H02K 5/20 |
| 2008/0169088 | A1 | 7/2008 | Aoki et al. | |
| 2008/0237847 | A1 * | 10/2008 | Nakanishi | F28F 3/12 |
| | | | | 257/722 |
| 2008/0291628 | A1 * | 11/2008 | Aoki | H01L 23/473 |
| | | | | 361/699 |
| 2009/0065178 | A1 * | 3/2009 | Kasezawa | H01L 23/473 |
| | | | | 165/104.19 |
| 2010/0172091 | A1 * | 7/2010 | Nishiura | H01L 23/473 |
| | | | | 361/689 |
| 2014/0043765 | A1 | 2/2014 | Gohara et al. | |
| 2014/0196871 | A1 * | 7/2014 | Otsuka | H01L 23/473 |
| | | | | 165/104.33 |
| 2015/0061111 | A1 * | 3/2015 | Nagai | H01L 23/473 |
| | | | | 257/714 |
| 2016/0183409 | A1 * | 6/2016 | Zhou | H01L 23/4735 |
| | | | | 165/104.31 |
| 2021/0057307 | A1 * | 2/2021 | Ushijima | H01L 23/473 |
| 2022/0181981 | A1 | 6/2022 | Suzuki et al. | |

FOREIGN PATENT DOCUMENTS

| | | | |
|---|---|---|---|
| JP | 2011-217553 | A | 10/2011 |
| JP | 2020-73845 | A | 5/2020 |
| JP | 2021-27097 | A | 2/2021 |
| JP | 2021-48753 | A | 3/2021 |
| JP | 2021-141729 | A | 9/2021 |
| WO | 2012/147544 | A1 | 11/2012 |

OTHER PUBLICATIONS

Office Action, dated Apr. 5, 2022, in corresponding Japanese Patent Application No. 2022-006342, with machine translation (9 pp.).
Japanese Office Action dated Apr. 12, 2022 issued in Japanese patent application No. 2022-006363.
Japanese Office Action dated Apr. 12, 2022 issued in Japanese patent application No. 2022-006384.

* cited by examiner

C1-C2 CROSS-SECTIONAL VIEW

PERSPECTIVE VIEW

B1-B2 CROSS-SECTIONAL VIEW

C1-C2 CROSS-SECTIONAL VIEW

PERSPECTIVE VIEW

B1-B2 CROSS-SECTIONAL VIEW

COOLER AND SEMICONDUCTOR APPARATUS

CROSS REFERENCE TO RELATED APPLICATION

This Application claims priority from Japanese Patent Application No. 2022-006342, filed Jan. 19, 2022, the entire contents of which are incorporated herein by reference.

BACKGROUND

Field of the Invention

The present invention relates to coolers and to semiconductor apparatuses.

Description of Related Art

Semiconductor apparatuses, such as a power converter, that convert DC power to AC power, are known. For example, Japanese Patent Application Laid-Open Publication No. 2021-141729 discloses a power converter having components, such as a power conversion circuit that converts DC power to AC power, and a cooler that cools switching elements included in the power conversion circuit. A heat generating device, such as the switching elements, is cooled by the cooler that uses a refrigerant, such as cooling water. For example, Japanese Patent Application Laid-Open Publication No. 2020-073845 discloses that a heat transfer plate thermally coupled to the heat generating device is cooled using a cooling fluid to cool a heat generating device.

Reduction in size of the cooler is desired in the semiconductor apparatus described above.

SUMMARY

In view of the above circumstances, one aspect of the present invention is directed to reducing the size of the cooler.

A cooler according to a preferred aspect of the present invention includes a cooling main body extending in a first direction, in which, the cooling main body includes: a cooling wall including a first surface on which a heat generator is to be arranged, and a second surface on an opposite side to the first surface; a first flow path extending in the first direction, and having an end into which a refrigerant flows; a second flow path extending in the first direction, and having an end from which the refrigerant flows out; and a plurality of cooling flow paths having the second surface as a part of a wall surface, in which the cooling main body includes: a cooling wall including a first surface on which a heat generator is to be arranged, and a second surface on an opposite side to the first surface; a first flow path extending in the first direction, and having an end into which a refrigerant flows; a second flow path extending in the first direction, and having an end from which the refrigerant flows out; and a plurality of cooling flow paths having the second surface as a part of a wall surface, the plurality of cooling flow paths are arrayed in the first direction, the plurality of cooling flow paths extend in a second direction intersecting with the first direction, the plurality of cooling flow paths are positioned between the first and second flow paths and the cooling wall in a third direction perpendicular to the first surface, and each of the plurality of cooling flow paths causes the first flow path and the second flow path to communicate with each other in the second direction.

A cooler according to another preferred aspect of the present invention includes a cooling main body extending in a first direction in which the cooling main portion includes: a cooling wall including a first surface on which a heat generator is to be arranged, and a second surface on an opposite side to the first surface; a first flow path extending in the first direction, and having an end into which a refrigerant flows; a second flow path extending in the first direction, and having an end from which the refrigerant flows out, and a plurality of cooling flow paths having the second surface as a part of a wall surface, in which the plurality of cooling flow paths are arrayed in the first direction, the plurality of cooling flow paths extend in a second direction intersecting with the first direction, and each of the cooling flow paths causes the first flow path and the second flow path to communicate with each other in the second direction.

A semiconductor apparatus according to a preferred aspect of the present invention includes any one of the foregoing coolers.

DESCRIPTION OF EMBODIMENTS

Figure 1:
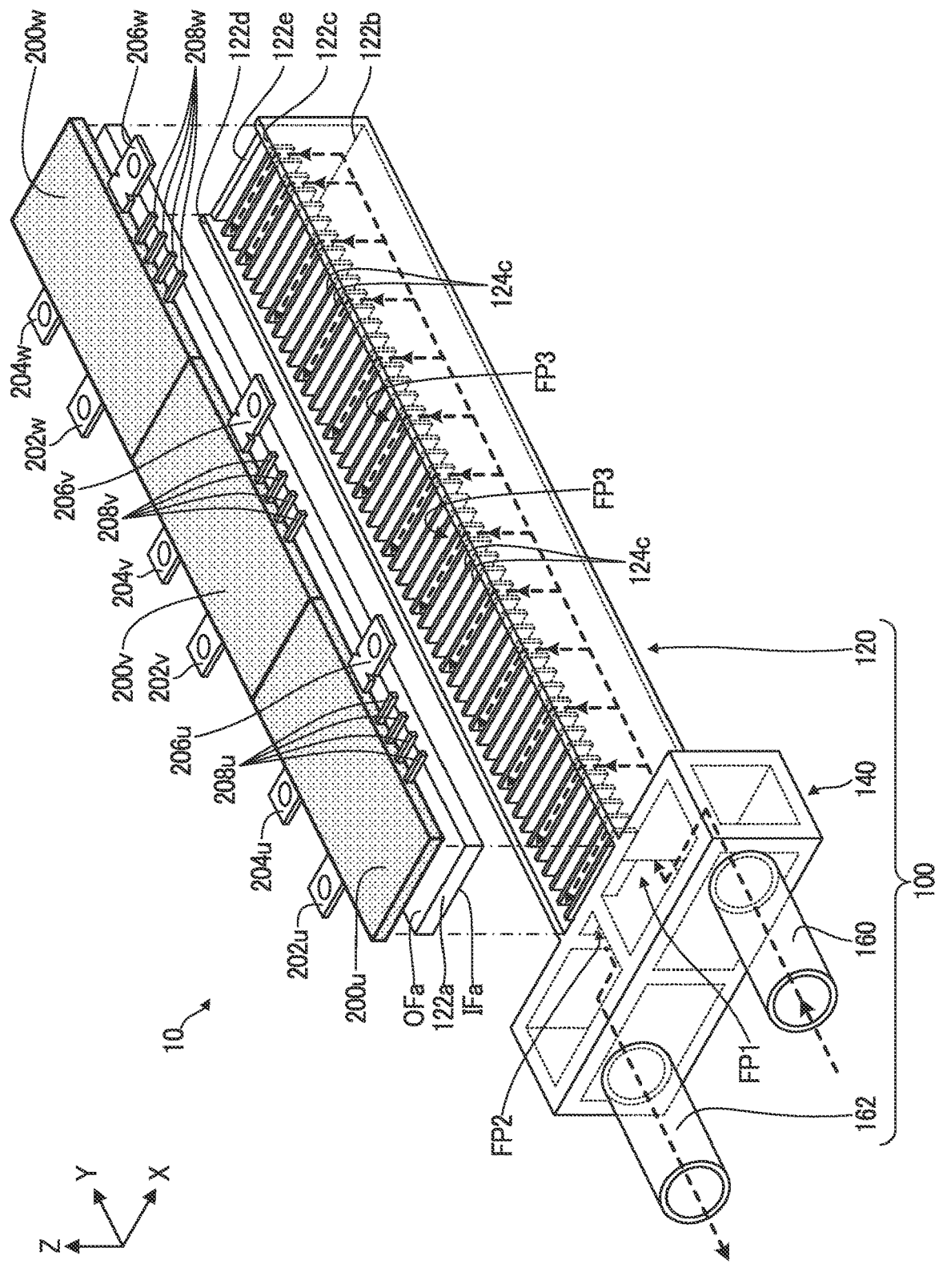
FIG. 1 is an exploded perspective view schematically illustrating relevant parts of a power converter according to an embodiment.

Embodiments according to the present invention are explained below with reference to the drawings. The dimensions and scales of parts in the drawings are different from actual products as appropriate. The embodiments described below are preferable specific examples of the present invention. Therefore, the following embodiments include various technically preferable limitations. However, the scope of the present invention is not limited to the embodiments unless described in the following explanations that the present invention is specifically limited.

A. Embodiment

An embodiment of the present invention is explained below. An example of the outline of a power converter 10 according to this embodiment is explained first with reference to FIG. 1.

FIG. 1 is an exploded perspective view schematically illustrating relevant parts of the power converter 10 according to the embodiment.

A rectangular coordinate system with three axes including an X-axis, a Y-axis, and a Z-axis perpendicular to each other is hereinafter adopted for the purpose of illustration.

Hereinafter, the direction indicated by the arrow of the X-axis is referred to as "+X direction" and the direction opposite to the +X direction is referred to as "−X direction." The direction indicated by the arrow of the Y-axis is referred to as "+Y direction" and the direction opposite to the +Y direction is referred to as "−Y direction." The direction indicated by the arrow of the Z-axis is referred to as "+Z direction" and the direction opposite to the +Z direction is referred to as "−Z direction." Hereinafter, the +Y direction and the −Y direction are sometimes referred to as "Y direction" without distinction, the +X direction and the −X direction are sometimes referred to as "X direction" without distinction. The +Z direction and the −Z direction are sometimes referred to as "Z direction" without distinction.

Each of the +Y direction and the −Y direction is an example of a "first direction," each of the +X direction and the −X direction is an example of a "second direction," and each of the +Z direction and the −Z direction is an example of a "third direction." Hereinafter, viewing an object from a certain direction is sometimes referred to as a "plan view."

Any power semiconductor apparatus such as an inverter or a converter may be adopted as the power converter 10.

The power converter 10 is an example of a "semiconductor apparatus." In this embodiment, the power converter 10 is a power semiconductor apparatus that converts DC power input to the power converter 10 to AC power of three phases including a U phase, a V phase, and a W phase.

For example, the power converter 10 has three semiconductor modules 200u, 200v, and 200w that convert DC power to AC power, and a cooler 100 that cools the semiconductor modules 200u, 200v, and 200w. The semiconductor modules 200u, 200v, and 200w are examples of a "heat generator."

Each of the semiconductor modules 200u, 200v, and 200w is a power semiconductor module that has a power semiconductor chip including a power semiconductor element such as a switching element accommodated in a resin case. Examples of the switching element include a power MOSFET (Metal Oxide Semiconductor Field Effect Transistor) and an IGBT (Insulated Gate Bipolar Transistor).

In one example, the semiconductor module 200u includes input terminals 202u and 204u, an output terminal 206u, and a plurality of control terminals 208u. The semiconductor module 200u converts DC power input to the input terminals 202u and 204u into U-phase AC power of the three-phase AC power, and outputs the U-phase AC power from the output terminal 206u. In one example, the potential of the input terminal 202u is higher than that of the input terminal 204u. Specifically, the DC power includes P-phase power and N-phase power and, for example, the P-phase power is input to the input terminal 202u while the N-phase power is input to the input terminal 204u. Control signals for controlling an operation of a switching element and the like included in the semiconductor module 200u are input to the control terminals 208u, respectively.

Each of the semiconductor modules 200v and 200w is the same as the semiconductor module 200u except for outputting the V-phase or W-phase AC power of the three-phase AC power. In one example, the semiconductor module 200v has input terminals 202v and 204v, an output terminal 206v, and control terminals 208v, and outputs the V-phase AC power from the output terminal 206v. In one example, the semiconductor module 200w has input terminals 202w and 204w, an output terminal 206w, and control terminals 208w, and outputs the W-phase AC power from the output terminal 206w.

Hereinafter, the semiconductor modules 200u, 200v, and 200w are simply referred to as "semiconductor module 200." The input terminals 202u, 202v, and 202w are simply referred to as "input terminal 202," the input terminals 204u, 204v, and 204w are simply referred to as "input terminal 204," and the output terminals 206u, 206v, and 206w are simply referred to as "output terminal 206."

The cooler 100 has a main body 120 extending in the Y direction, a supply pipe 160 that supplies a refrigerant to the main body 120, a discharge pipe 162 that discharges the refrigerant from the main body 120, and a header portion 140 that connects the supply pipe 160 and the discharge pipe 162 to the main body 120. Dashed arrows in FIG. 1 indicate an example of the flow of the refrigerant. In this embodiment, the refrigerant is a fluid such as water.

The main body 120 is an example of a "cooling main body." FIG. 1 illustrates the outline of the main body 120. Details of the main body 120 are explained with reference to FIGS. 3 and 4, described later. The header portion 140 is explained with reference to FIG. 2, described later.

The main body 120 is, for example, a hollow structure formed into a cuboid extending in the Y direction. For example, the main body 120 has an inflow path FP1 extending in the Y direction and having an end into which the refrigerant flows, an outflow path FP2 extending in the Y direction and having an end from which the refrigerant flows out, and cooling flow paths FP3. The other end (an end portion in the +Y direction) of each of the inflow path FP1 and the outflow path FP2 is defined by an outer wall 122e. The inflow path FP1 is an example of a "first flow path" and the outflow path FP2 is an example of a "second flow path."

The main body 120 has an outer wall 122a on which the semiconductor module 200 is arranged. The outer wall 122a includes an outer surface OFa on which the semiconductor module 200 is arranged, and an inner surface IFa on the opposite side to the outer surface OFa. The inner surface IFa is a part of wall surfaces of the cooling flow paths FP3. The outer wall 122a is an example of a "cooling wall," the outer surface OFa is an example of a "first surface," and the inner surface IFa is an example of a "second surface."

The cooling flow paths FP3 are arrayed in the Y direction and extend in the X direction intersecting with the Y direction. One end and the other end of each of the cooling flow paths FP3 are defined by outer walls 122c and 122d, respectively. In one example, the main body 120 has a plurality of partitions 124c arrayed in the Y direction and extending in the X direction. Two of the cooling flow paths FP3 adjacent to each other are separated from each other by a partition 124c positioned between the two cooling flow paths FP3.

Figure 4:
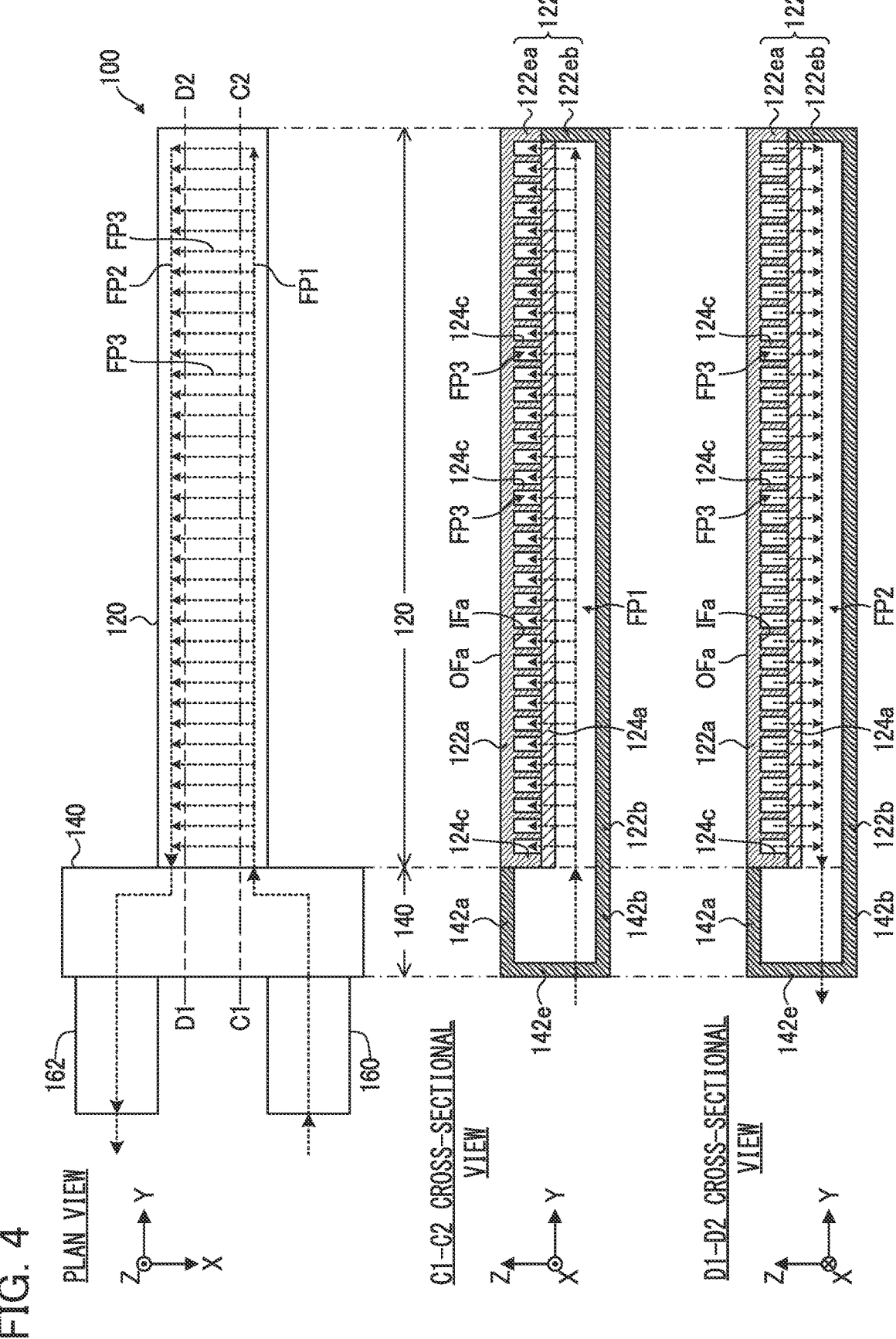
FIG. 4 is another explanatory diagram for the main body illustrated in FIG. 1.

FIG. 1 illustrates the partitions 124c away from the outer wall 122a to clarify the flow of the refrigerant. In this embodiment, the partitions 124c are formed integrally with the outer wall 122a as illustrated in FIG. 4. The partitions 124c are an example of a "third partition." The number of the partitions 124c is not limited to being multiple. One partition 124c may be provided when the number of the cooling flow paths FP3 is two.

The cooling flow paths FP3 are positioned between the inflow path FP1 and the outflow path FP2, and the outer wall 122a in the Z direction perpendicular to the outer face OFa. Each of the cooling flow paths FP3 causes the inflow path FP1 and the outflow path FP2 to communicate with each other in the X direction.

The cooler 100 cools the semiconductor module 200 arranged on the outer surface OFa of the outer wall 122a using the refrigerant flowing through the cooling flow paths FP3. The flow paths FP has the inner surface IFa of the outer wall 122a and is a part of the wall surfaces. In one example, heat generated in the semiconductor module 200 is released to the refrigerant via the outer wall 122a.

The main body 120 is made of a material high in thermal conductivity. Specific constituent materials of the main body 120 include metals such as copper, aluminum, and alloys of either thereof. The header portion 140, the supply pipe 160, and the discharge pipe 162 are made of, for example, the same material as the main body 120. That is, specific constituent materials of the header portion 140, the supply pipe 160, and the discharge pipe 162 include metals such as copper, aluminum, and alloys of either thereof. One, some, or all of the header portion 140, the supply pipe 160, and the discharge pipe 162 may be made of a material different from the main body 120.

The shape of the main body 120 is not limited to the cuboid extending in the Y direction. The shape of the main body 120 in plan view from the −Y direction may be a shape having curved lines. That is, the outer walls 122c and 122d may be curved.

The header portion 140 is explained next with reference to FIG. 2.

Figure 2:
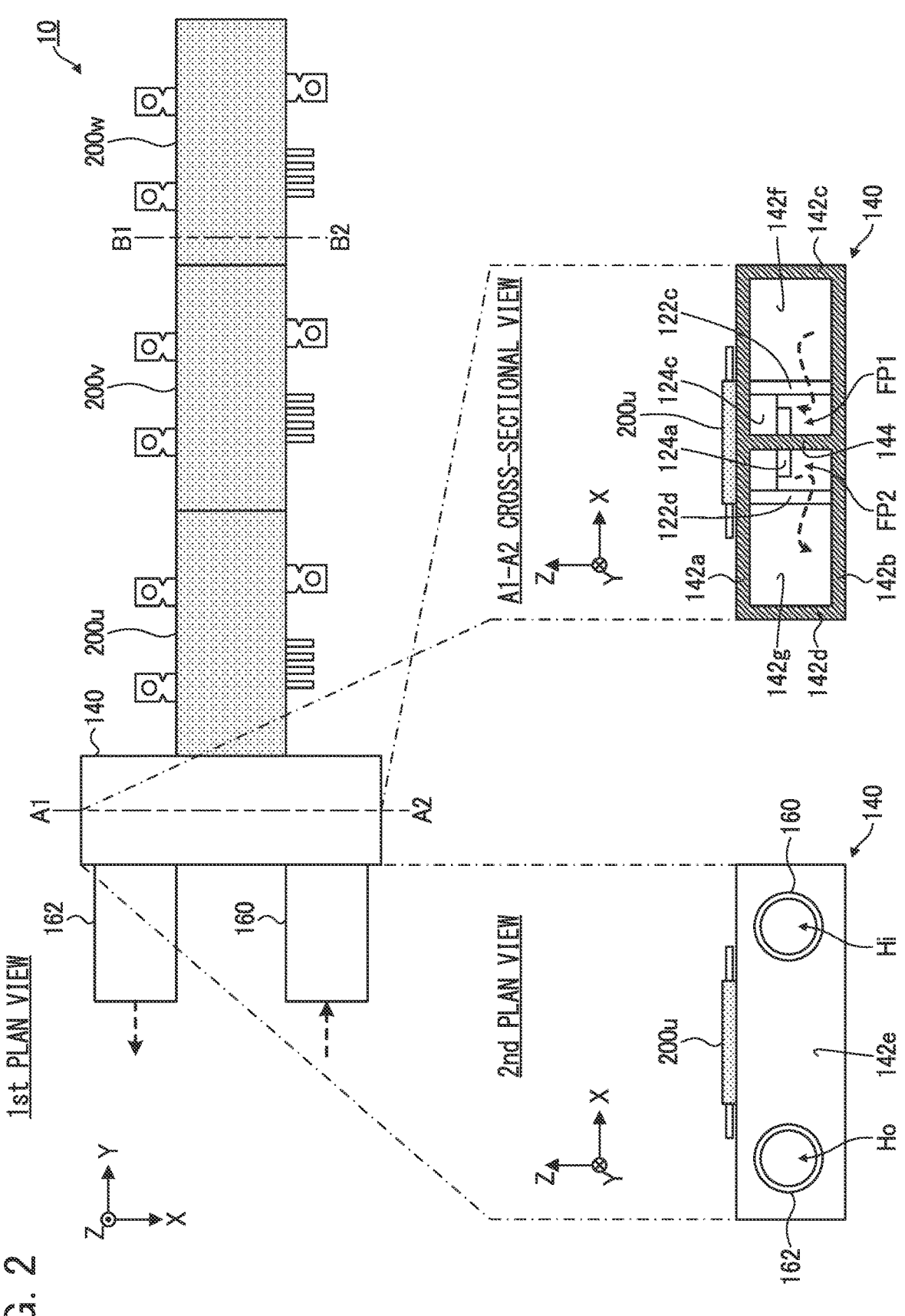
FIG. 2 is an explanatory diagram for a header portion illustrated in FIG. 1.

FIG. 2 is an explanatory diagram for the header portion 140 illustrated in FIG. 1. FIG. 2 includes a first plan view of the cooler 100 and the semiconductor module 200 as viewed from the +Z direction, and a second plan view of the cooler 100 and the semiconductor module 200 as viewed from the −Y direction. FIG. 2 further includes A1-A2 cross-sectional view of the cooler 100 taken along line A1-A2 in the first plan view. In FIG. 2, illustrations of reference signs such as the input terminal 202u are omitted for simplicity. Illustrations of reference signs such as the input terminal 202u are appropriately omitted also in the drawings following FIG. 2.

The header portion 140 is, for example, a hollow cuboid having an opening communicating with the inflow path FP1, an opening communicating with the outflow path FP2, a supply port Hi, and a discharge port Ho.

The supply port Hi and the discharge port Ho are openings formed on an outer wall 142e substantially parallel to an X-Z plane as illustrated in the second plan view. Descriptions such as "substantially parallel" indicate concepts including error. For example, in a case in which elements are "substantially parallel," it suffices that the elements are parallel to each other in design. The supply pipe 160 and the discharge pipe 162 are connected to the outer wall 142e. For example, the supply pipe 160 is connected to the outer wall 142e in such a manner that the flow path in the supply pipe 160 is communicated with the supply port Hi, and the discharge pipe 162 is connected to the outer wall 142e in such a manner that the flow path in the discharge pipe 162 is communicated with the discharge port Ho.

As illustrated in the A1-A2 cross-sectional view, the header portion 140 has outer walls 142a and 142b substantially parallel to an X-Y plane, outer walls 142c and 142d substantially parallel to a Y-Z plane, and outer walls 142f and 142g substantially parallel to the X-Z plane, as well as the outer wall 142e. The header portion 140 also has a partition 144 substantially parallel to the Y-Z plane.

The outer walls 142f and 142g are arranged away from the outer wall 142e in the +Y direction and are connected to the outer walls 122c and 122d of the main body 120, respectively. The partition 144 separating a flow path from the supply port Hi to the inflow path FP1 and a flow path from the outflow path FP2 to the discharge port Ho from each other is arranged between the outer walls 122c and 122d of the main body 120 in the X direction. In one example, the partition 144 is connected to the outer walls 142a and 142b, a partition 124c closest to the header portion 140 among the partitions 124c of the main body 120, a partition 124a of the main body 120, and a partition 124b of the main body 120, which will be described later with reference to FIG. 3.

The shape of the header portion 140 is not limited to that illustrated in FIG. 2. The shape of the header portion 140 in plan view from the −Y direction may be a shape having curved lines. That is, the outer walls 142c and 142d may be curved.

The main body 120 is explained next with reference to FIGS. 3 and 4.

Figure 3:
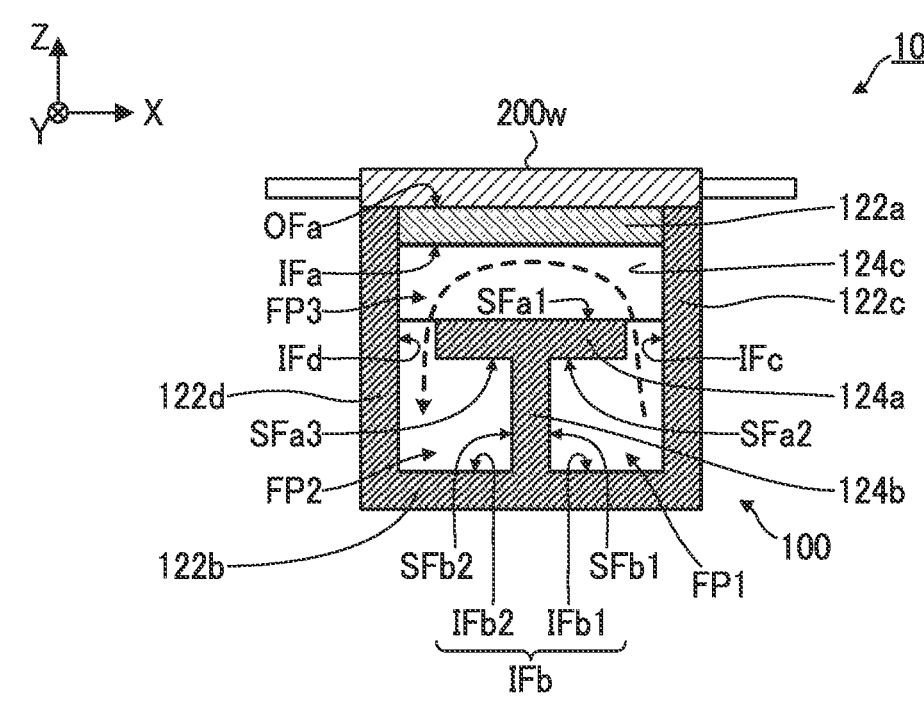
FIG. 3 is an explanatory diagram for a main body illustrated in FIG. 1.

FIG. 3 is an explanatory diagram for the main body 120 illustrated in FIG. 1. FIG. 3 shows a cross-sectional view of the power converter 10 taken along line B1-B2 illustrated in the first plan view of FIG. 2. A dashed arrow in FIG. 3 indicates the flow of the refrigerant. Illustrations of elements such as the switching element included in the semiconductor module 200 are omitted in the cross-sectional view of the semiconductor module 200.

Illustrations of the elements such as the switching element included in the semiconductor module 200 are also omitted in cross-sectional views of the semiconductor module 200 illustrated in the drawings following FIG. 3.

The main body 120 has the partitions 124a and 124b in addition to the outer walls 122a, 122b, 122c, 122d, and 122e and the partitions 124c explained with reference to FIG. 1. The partition 124a is an example of a "first partition," and the partition 124b is an example of a "second partition." Hereinafter, the outer walls 122a, 122b, 122c, 122d, and 122e are sometimes collectively referred to as "outer wall 122."

The partition 124a is arranged between the outer walls 122a and 122b. That is, the partition 124a is arranged to be spaced from the outer wall 122a in the −Z direction. In this embodiment, the partition 124a is substantially parallel to the outer wall 122a. In one example, a surface SFa1 directed to the inner surface IFa of the outer wall 122a among the surfaces of the partition 124a is substantially parallel to the inner surface IFa of the outer wall 122a. The surface SFa1 of the partition 124a may be non-parallel to the inner surface IFa of the outer wall 122a. The surface SFa1 of the partition 124a may be inclined in such a manner that an edge of the surface SFa1 in the +X direction is more distant from the outer wall 122a.

The partition 124a arranged between the outer walls 122a and 122b separates the inflow path FP1 from the cooling flow paths FP3, and separates the outflow path FP2 from the cooling flow paths FP3. A space enabling the inflow path FP1 to communicate with the cooling flow paths FP3 is provided between the edge of the partition 124a in the +X direction and the inner surface IFc of the outer wall 122c. Similarly, a space enabling the outflow path FP2 to communicate with the cooling flow paths FP3 is provided between an edge of the partition 124a in the −X direction and the inner surface IFd of the outer wall 122d. That is, each of the cooling flow paths FP3 is communicated with the inflow path FP1 at one end, and is communicated with the outflow path FP2 at the other end in this embodiment.

The partition 124b is arranged between the outer walls 122c and 122d and is connected to the partition 124a and the outer wall 122b. In one example, a surface SFb1 of the partition 124b is a surface directed to the inner surface IFc of the outer wall 122c among the surfaces of the partition 124$b$, and is substantially parallel to the inner surface IFc of the outer wall 122$c$. A surface SFb2 of the partition 124$b$ is a surface directed to the inner surface IFd of the outer wall 122$d$ among the surfaces of the partition 124$b$, and is substantially parallel to the inner surface IFd of the outer wall 122$d$.

The partition 124$b$ arranged between the outer walls 122$c$ and 122$d$ separates the inflow path FP1 and the outflow path FP2 from each other. In one example, a surface SFa2 of the partition 124$a$, the surface SFb1 of the partition 124$b$, and an inner surface IFb1 of the outer wall 122$b$ are parts of the wall surface of the inflow path FP1. A surface SFa3 of the partition 124$a$, the surface SFb2 of the partition 124$b$, and an inner surface IFb2 of the outer wall 122$b$ are parts of the wall surface of the outflow path FP2. The surface SFa2 of the partition 124$a$ is a portion of the opposite surface to the surface SFa1, which is located in the +X direction relative to the partition 124$b$. The surface SFa3 of the partition 124$a$ is a portion of the opposite surface to the surface SFa1, which is located in the −X direction relative to the partition 124$b$. The inner surface IFb1 of the outer wall 122$b$ is a portion of an inner surface IFb of the outer wall 122$b$, which is located in the +X direction relative to the partition 124$b$, and the inner surface IFb2 of the outer wall 122$b$ is a portion of the inner surface IFb of the outer wall 122$b$, which is located in the −X direction relative to the partition 124$b$.

The partitions 124$c$ are walls substantially perpendicular to the outer wall 122$a$ and extend in the X direction. In one example, the partitions 124$c$ are arranged between the partition 124$a$ and the outer wall 122$a$ and are connected to the outer walls 122$a$, 122$c$, and 122$d$ and the partition 124$a$. That is, the partitions 124$c$ are connected to both the partition 124$a$ and the outer wall 122$a$ in this embodiment. The partitions 124$c$ may be connected to only one of the partition 124$a$ and the outer wall 122$a$. Each of the cooling flow paths FP3 is formed between ones of the partitions 124$c$ adjacent to each other. The inner surface IFa of the outer wall 122$a$ and the surface SFa1 of the partition 124$a$ are parts of the wall surfaces of the cooling flow paths FP3.

In this embodiment, the semiconductor module 200 is arranged on the outer surface OFa of the outer wall 122$a$ including the inner surface IFa that is a part of the wall surfaces of the cooling flow paths FP3. Accordingly, heat generated in the semiconductor module 200 is transferred from a surface directed to the outer surface OFa of the outer wall 122$a$ in the surface of the semiconductor module 200 to the refrigerant inside the cooling flow paths FP3. The semiconductor module 200 is cooled by so-called single side cooling. Although not particularly illustrated in FIG. 3, a TIM (Thermal Interface Material) such as thermal conductive grease, thermal conductive adhesive, thermal conductive sheet, or solder may be interposed between the semiconductor module 200 and the outer surface OFa of the outer wall 122$a$.

Since the cooling flow paths FP3 are positioned between the inflow path FP1 and the outflow path FP2, and the outer wall 122$a$ in the Z direction in this embodiment, a space is provided in the Z direction of the terminals (such as the input terminals 202 and 204 and the output terminal 206) of the semiconductor module 200. In one example, the inflow path FP1 and the outflow path FP2 are positioned in the −Z direction with respect to the partitions 124$c$ separating the cooling flow paths FP3. Accordingly, the inner surface IFc of the outer wall 122$c$ defining one end of each of the cooling flow paths FP3 is a part of the wall surface of the inflow path FP1, and the inner surface IFd of the outer wall 122$d$ defining the other end of each of the cooling flow paths FP3 is a part of the wall surface of the outflow path FP2 in this embodiment. In this case, a space is provided in the Z direction of the terminals of the semiconductor module 200, and therefore, lines and the similar parts are connected to the terminals of the semiconductor module 200.

FIG. 4 is another explanatory diagram for the main body 120 illustrated in FIG. 1. FIG. 4 includes a plan view of the cooler 100 as viewed from the +Z direction. FIG. 4 further includes a cross-sectional view of the cooler 100 taken along line C1-C2, and a cross-sectional view of the cooler 100 taken along line D1-D2. Dashed arrows in the drawings indicate the flow of the refrigerant.

The refrigerant having flowed from the supply pipe 160 into the inflow path FP1 flows in any of the cooling flow paths FP3. Heat exchange is performed between the refrigerant having flowed into the cooling flow paths FP3 and the semiconductor module 200. The refrigerant having flowed into the cooling flow paths FP3 flows in the outflow path FP2. The refrigerant having flowed into the outflow path FP2 is discharged from the discharge pipe 162. In this way, the semiconductor module 200 is cooled by a fresh refrigerant flowing from the inflow path FP1 into the cooling flow paths FP3 in this embodiment. The fresh refrigerant refers to a refrigerant before the heat exchange with the semiconductor module 200, or a refrigerant at an almost same temperature as that of the refrigerant before the heat exchange with the semiconductor module 200.

In this embodiment, the partitions 124$c$ are formed integrally with the outer wall 122$a$ as illustrated in the C1-C2 cross-sectional view and the D1-D2 cross-sectional view. In one example, the contact area between a structure in which the outer wall 122$a$ and the partitions 124$c$ are formed integrally with each other and the refrigerant is larger than the contact area between the outer wall 122$a$ and the refrigerant in a case in which the partitions 124$c$ are not connected to the outer wall 122$a$. Therefore, the efficiency of heat transfer is improved in a case in which heat is transferred from the semiconductor module 200 to the refrigerant via the outer wall 122$a$ in this embodiment.

In FIG. 4, a portion of the outer wall 122$e$ formed integrally with the outer wall 122$a$ is referred to as "outer wall 122$ea$" and a portion of the outer wall 122$e$ other than the outer wall 122$ea$ is referred to as "outer wall 122$eb$."

A manufacturing method of elements such as the partitions 124$c$ is not particularly limited. The partitions 124$c$ formed integrally with the outer wall 122$a$ may be connected to the partition 124$a$ or be unconnected to the partition 124$a$. The partitions 124$c$ are not formed integrally with the outer wall 122$a$. In this case, the partitions 124$c$ may be formed integrally with the partition 124$a$. The partitions 124$c$ formed integrally with the partition 124$a$ may be connected to the outer wall 122$a$ or be unconnected to the outer wall 122$a$. Alternatively, the partitions 124$c$ formed separately from the outer wall 122$a$ and the partition 124$a$ may be connected to one or both of the outer wall 122$a$ and the partition 124$a$.

A mode (hereinafter, "comparative example") in which the semiconductor module 200 is cooled from both sides is explained as a mode to be compared with the power converter 10 with reference to FIG. 5.

Figure 5:
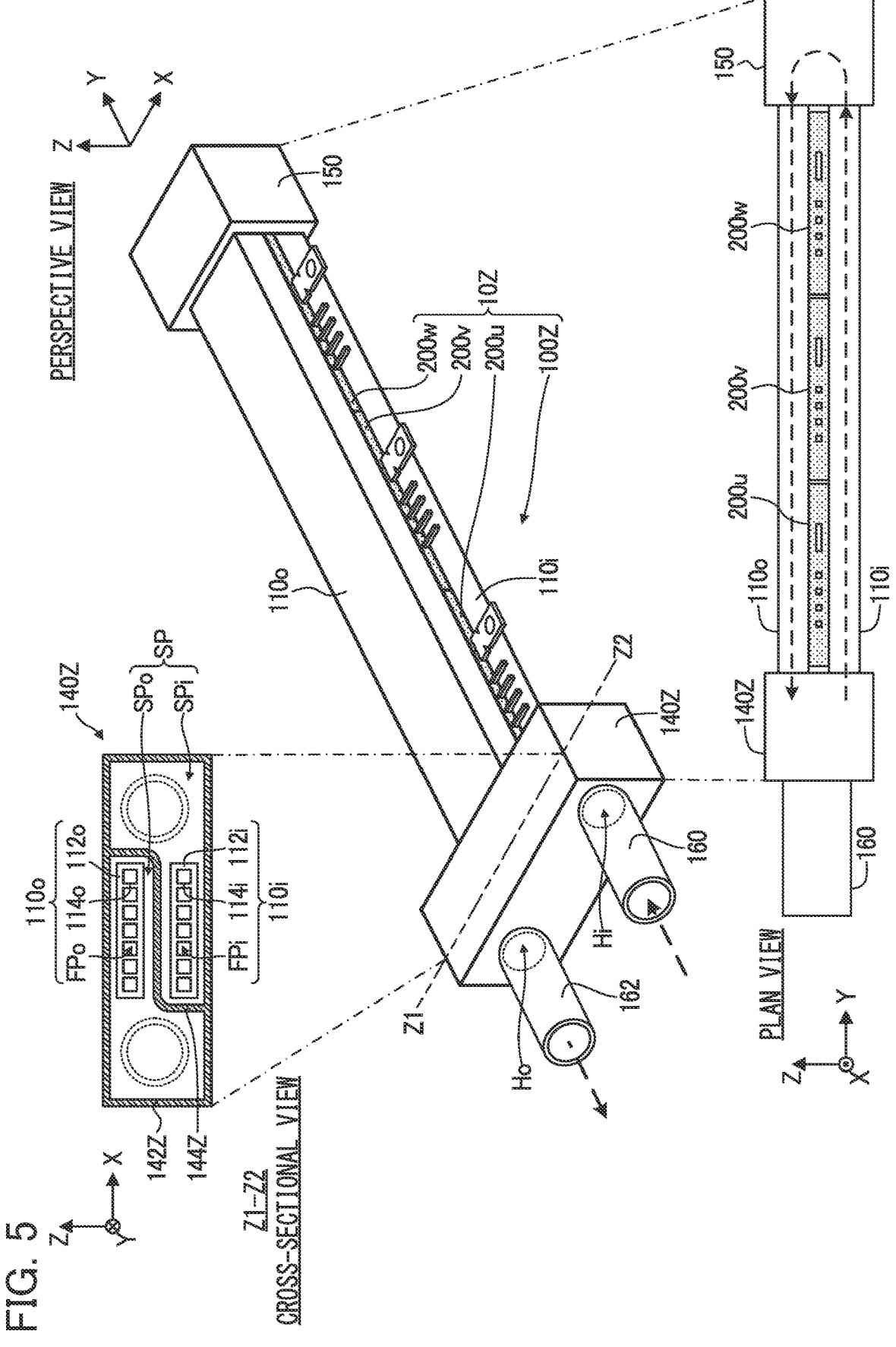
FIG. 5 is an explanatory diagram for an example of a power converter according to a comparative example.

FIG. 5 is an explanatory diagram for an example of a power converter 10Z according to the comparative example. A perspective view, a plan view, and a cross-sectional view of the power converter 10Z are illustrated in FIG. 5. FIG. 5 includes a plan view of the power converter 10Z as viewed from the +X direction. FIG. 5 further includes a cross-sectional view of the power converter 10Z taken along line Z1-Z2. Portions corresponding to the positions of the supply pipe 160 and the discharge pipe 162 seen from the −Y direction are indicated by dashed lines in the Z1-Z2 cross-sectional view of FIG. 5. Dashed arrows in FIG. 5 indicate the flow of the refrigerant.

The power converter 10Z has, for example, the three semiconductor modules 200u, 200v, and 200w, and a cooler 100Z that cools the semiconductor modules 200u, 200v, and 200w. The cooler 100Z has multi-hole pipes 110i and 110o extending in the Y direction, the supply pipe 160 supplying the refrigerant to the multi-hole pipe 110i, the discharge pipe 162 discharging the refrigerant from the multi-hole pipe 110o, and header portions 140Z and 150.

The header portion 140Z connects the supply pipe 160 to the multi-hole pipe 110i, and connects the discharge pipe 162 to the multi-hole pipe 110o. In one example, the header portion 140Z is a hollow cuboid having an opening through which an end portion of the multi-hole pipe 110i is inserted, an opening through which an end portion of the multi-hole pipe 110o is inserted, the supply port Hi, and the discharge port Ho. The header portion 140Z has a partition 144Z that divides a space SP defined by an outer wall 142Z into a space SPi and a space SPo.

The multi-hole pipe 110i has a plurality of cooling flow paths FPi. In one example, the multi-hole pipe 110i is a hollow cuboid open at both ends. One of the ends of the multi-hole pipe 110i is connected to the header portion 140Z, and the other end of the multi-hole pipe 110i is connected to the header portion 150. The multi-hole pipe 110i has a plurality of partitions 114i extending in the Y direction and arrayed in the X direction. The partitions 114i divide a space defined by an outer wall 112i into the cooling flow paths FPi extending in the Y direction. The cooling flow paths FPi are communicated with the flow path in the supply pipe 160 via the space SPi in the header portion 140Z. That is, the refrigerant flows in the cooling flow paths FPi from the supply pipe 160.

The multi-hole pipe 110o has a plurality of cooling flow paths FPo. In one example, the multi-hole pipe 110o is a hollow cuboid open at both ends. One of the ends of the multi-hole pipe 110o is connected to the header portion 140Z, and the other end of the multi-hole pipe 110o is connected to the header portion 150. The multi-hole pipe 110o has a plurality of partitions 114o extending in the Y direction and arrayed in the X direction. The partitions 114o divide a space defined by an outer wall 112o into the cooling flow paths FPo extending in the Y direction. The cooling flow paths FPo are communicated with the flow path in the discharge pipe 162 via the space SPo of the header portion 140Z. That is, the refrigerant is discharged from the cooling flow paths FPo to the discharge pipe 162.

The header portion 150 enables the cooling flow paths FPi and the cooling flow paths FPo to communicate with each other. In one example, the header portion 150 is a hollow cuboid having an opening through which an end portion of the multi-hole pipe 110i is inserted, and an opening through which an end portion of the multi-hole pipe 110o is inserted. The refrigerant having flowed in the cooling flow paths FPi flows in the cooling flow paths FPo through a space in the header portion 150.

The semiconductor module 200 is arranged between the multi-hole pipe 110i and the multi-hole pipe 110o. By this arrangement, the semiconductor module 200 is cooled from both sides. In the cooler 100Z, the cooling flow paths FPi extend in the Y direction that is the longer direction of the cooler 100Z. Therefore, the temperature of the refrigerant with which the semiconductor module 200w arranged at a location far from the supply port Hi undergoes heat exchange is higher than the temperature of the refrigerant with which the semiconductor module 200u arranged at a location near the supply port Hi undergoes heat exchange. The cooling efficiency for the semiconductor module 200w is lower than that for the semiconductor module 200u in the cooler 100Z.

The cooling flow paths FP3 extend in the X direction that is the shorter direction of the cooler 100 in this embodiment. Therefore, in this embodiment, a difference in temperature of the refrigerant between one end and the other end of each of the cooling flow paths FP3 is reduced as compared to the cooler 100Z, which is the comparative example. Furthermore, in this embodiment, a fresh refrigerant such as a refrigerant before heat exchange with the semiconductor module 200 flows from the inflow path FP1 in each of the cooling flow paths FP3 arrayed in the Y direction that is the longer direction of the cooler 100. As a result, the reduction in the cooling efficiency for the semiconductor module 200w arranged at a location far from the supply port Hi is suppressed in this embodiment. That is, the cooling efficiency for the semiconductor module 200 cis improved in this embodiment.

Since the semiconductor module 200 is cooled by single side cooling using the cooling flow paths FP3 in this embodiment, the header portion 150 for flowing the refrigerant having flowed in the cooling flow paths FPi into the cooling flow paths FPo does not need to be installed. Therefore, the size of the cooler 100 in the Y direction is decreased relative to the cooler 100Z in this embodiment. That is, the cooler 100 as well as the power converter 10 are reduced in size in this embodiment.

A schematic internal structure of the entire power converter 10 is explained next with reference to FIG. 6.

Figure 6:
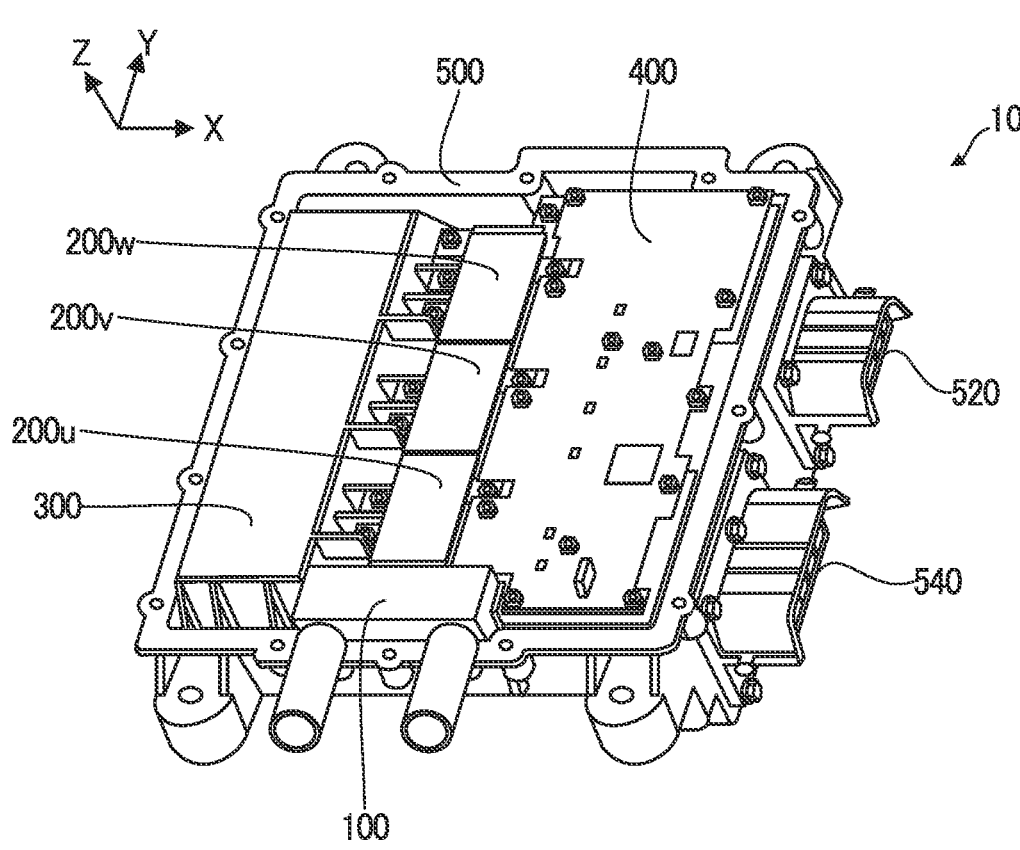
FIG. 6 is a perspective view illustrating an example of a schematic internal structure of the entire power converter.

FIG. 6 is a perspective view illustrating an example of the schematic internal structure of the entire power converter 10.

The power converter 10 has a capacitor 300, a control substrate 400, a casing 500, an input connector 520, an output connector 540, and the like, in addition to the cooler 100 and the semiconductor module 200 illustrated in FIG. 1 and other drawings. The capacitor 300 smooths a DC voltage applied between the input terminals 202 and 204 of the semiconductor module 200. A control circuit that controls the semiconductor module 200, and the like are installed on the control substrate 400. The casing 500 accommodates inner parts of the power converter 10, such as the cooler 100, the semiconductor module 200, the capacitor 300, and the control substrate 400. The casing 500 is provided with the input connector 520 and the output connector 540. In one example, a DC voltage is applied between the input terminals 202 and 204 of the semiconductor module 200 from a DC power source (not illustrated) via the input connector 520. AC power of three phases including a U phase, a V phase, and a W phase is output from the output terminal 206 of the semiconductor module 200 to an external device (not illustrated; for example, a motor) via the output connector 540.

The configuration of the power converter 10 is not limited to the example illustrated in FIG. 6. Since the semiconductor module 200 is cooled from one side in this embodiment, the size of the cooler 100 in the Z direction is decreased. Therefore, a space for arranging other members and the like is provided in the +Z direction of the semiconductor module 200 in this embodiment. The control substrate 400 may be arranged in such a manner that a part thereof overlaps with the semiconductor module 200 in plan view from the +Z direction. In this case, the size of the power converter 10 in the X direction is decreased while increase in the size of the power converter 10 in the Z direction is suppressed.

In this manner, the power converter 10 has the cooler 100 in this embodiment. The cooler 100 has the main body 120 extending in the Y direction. The main body 120 has the outer wall 122a including the outer surface OFa on which the semiconductor module 200 is arranged, and the inner surface IFa on the opposite side to the outer surface OFa. The main body 120 further includes the inflow path FP1 that extends in the Y direction and that has an end into which a refrigerant flows, the outflow path FP2 that extends in the Y direction and that has an end from which the refrigerant flows out, and the cooling flow paths FP3 having the inner surface IFa as a part of the wall surface. The cooling flow paths FP3 are arrayed in the Y direction and extend in the X direction intersecting with the Y direction. The cooling flow paths FP3 are positioned between the inflow path FP1 and the outflow path FP2, and the outer wall 122a in the Z direction perpendicular to the outer surface OFa. Each of the cooling flow paths FP3 causes the inflow path FP1 and the outflow path FP2 to communicate with each other in the X direction.

As described above, in this embodiment, the semiconductor module 200 is cooled by a refrigerant flowing in the cooling flow paths FP3 that enable the inflow path FP1 and the outflow path FP2 to communicate with each other in the X direction. Therefore, it is unnecessary in this embodiment to form a flow path for flowing the refrigerant having flowed in the inflow path FP1 into the outflow path FP2, separately from the cooling flow paths FP3. In this embodiment, a structure (for example, a structure corresponding to the header portion 150 illustrated in FIG. 5) forming a flow path for flowing the refrigerant having flowed in the inflow path FP1 into the outflow path FP2 does not need to be provided separately from a structure (for example, the outer wall 122a) forming the cooling flow paths FP3. As a result, the cooler 100 is reduced in size in this embodiment, and thus, the power converter 10 including the cooler 100 is reduced in size.

In this embodiment, the cooling flow paths FP3 are arrayed in the Y direction that is the longer direction of the main body 120 and extend in the X direction that is the shorter direction of the main body 120. In one example, a fresh refrigerant such as a refrigerant before heat exchange with the semiconductor module 200 flows from the inflow path FP1 into each of the cooling flow paths FP3. It is possible to suppress an increase in the difference between the cooling efficiency at portions of the cooling flow paths FP3 near one end of the inflow path FP1 and the cooling efficiency at portions near the other end of the inflow path FP1. As a result, the cooling efficiency for the entire semiconductor module 200 is improved in this embodiment.

Since the cooling flow paths FP3 are positioned between the inflow path FP1 and the outflow path FP2, and the outer wall 122a in the Z direction in this embodiment, interference of the main body 120 at the time of connecting lines and similar parts to the terminals of the semiconductor module 200 is suppressed. For example, a space can be provided in the Z direction of terminals (for example, the input terminals 202 and 204 and the output terminal 206) of the semiconductor module 200 protruded from the outer wall 122a in plan view from the Z direction. As a result, lines and similar parts are connected with ease to the terminals of the semiconductor module 200 in this embodiment.

In this embodiment, the main body 120 has the partition 124a, the partition 124b, and one or more partitions 124c. The partition 124a is arranged away from the outer wall 122a in the Z direction to separate the inflow path FP1 from the cooling flow paths FP3 and separate the outflow path FP2 from the cooling flow paths FP3. The partition 124b separates the inflow path FP1 and the outflow path FP2 from each other. The partitions 124c are arranged between the partition 124a and the outer wall 122a, extend in the X direction, and separate adjacent ones of the cooling flow paths FP3 from each other. In this way, the cooling flow paths FP3 positioned between the inflow path FP1 and the outflow path FP2, and the outer wall 122a in the Z direction are formed with ease by the partitions 124a, 124b, and 124c in this embodiment.

In this embodiment, the partitions 124c are connected to both the partition 124a and the outer wall 122a. Accordingly, this embodiment can suppress flow into each of the cooling flow paths FP3 of the refrigerant that has performed heat exchange with the semiconductor module 200 in other cooling flow paths FP3. As a result, fresh refrigerant, such as a refrigerant before heat exchange with the semiconductor module 200, is flowed into each of the cooling flow paths FP3 from the inflow path FP1. The cooling efficiency in each of the cooling flow paths FP3 is improved.

In this embodiment, the partitions 124c may be connected to only one of the partition 124a and the outer wall 122a. In this case, the partitions 124c are formed with ease. In one example, the main body 120 may be formed by connecting the outer wall 122a connected to the partitions 124c to another outer wall 122 (for example, the outer walls 122c and 122d) of the main body 120. In this case, it is possible that some or all of the partitions 124c connected to the outer wall 122a are in contact with the partition 124a or are not in contact with the partition 124a. Alternatively, the partition 124a connected to the partitions 124c may be formed. In this case, it is possible that some or all of the partitions 124c connected to the partition 124a are in contact with the outer wall 122a or are not in contact with the outer wall 122a.

B: Modifications

The embodiments illustrated above can be variously modified. Specific aspects of modifications that can be applied to the embodiments described above are illustrated below. Two or more of the aspects freely selected from the following exemplifications may be appropriately combined with each other as long as they do not conflict.

B1: First Modification

Although the cooler 100 having the header portion 140 is illustrated in the embodiment described above, the present invention is not limited to this mode. The cooler 100 may not have the header portion 140.

Figure 7:
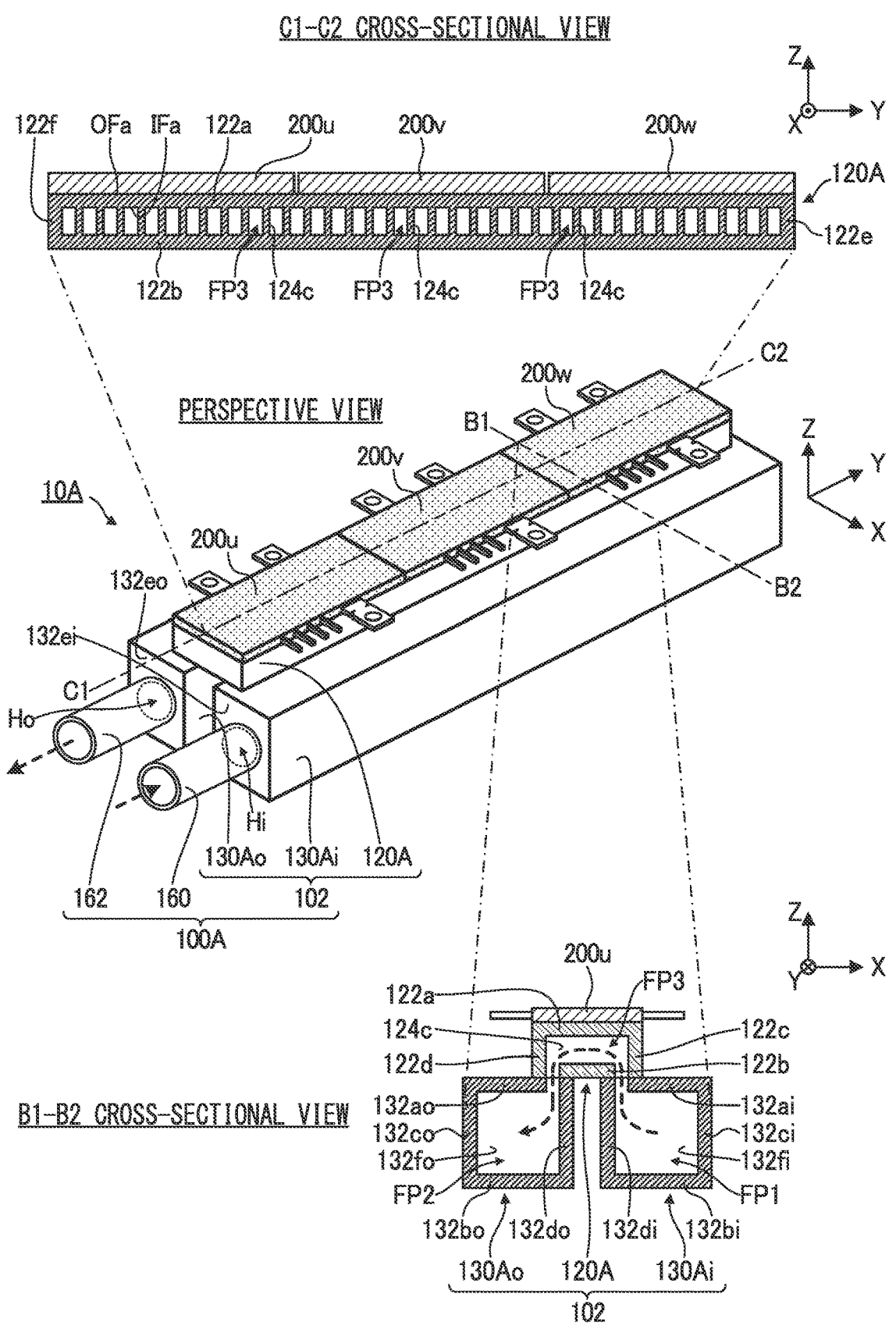
FIG. 7 is an explanatory diagram for an example of a power converter according to a first modification.

FIG. 7 is an explanatory diagram for an example of a power converter 10A according to a first modification. FIG. 7 includes a perspective view of the power converter 10A and a cross-sectional view thereof taken along line B1-B2. FIG. 7 further includes a cross-sectional view of a cooling pipe 120A and the semiconductor module 200 taken along line C1-C2. Dashed arrows in FIG. 7 indicate the flows of the refrigerant. Elements substantially the same as the elements described in FIGS. 1 to 6 are denoted by like reference signs, and detailed explanations thereof are omitted.

The power converter 10A has the three semiconductor modules 200u, 200v, and 200w, and a cooler 100A that cools the semiconductor modules 200u, 200v, and 200w. The cooler 100A has the main body 102 extending in the Y direction, the supply pipe 160, and the discharge pipe 162. The power converter 10A is another example of the "semiconductor apparatus," and the main body 102 is another example of the "cooling main body."

The main body 102 has the cooling pipe 120A including the cooling flow paths FP3 arrayed in the Y direction and extending in the X direction, a transport pipe 130Ai including the inflow path FP1 extending in the Y direction, and a transport pipe 130Ao including the outflow path FP2 extending in the Y direction.

The cooling pipe 120A has the outer walls 122a and 122b substantially parallel to the X-Y plane, the outer walls 122c and 122d substantially parallel to the Y-Z plane, and the outer wall 122e and an outer wall 122f substantially parallel to the X-Z plane. A space enabling the inflow path FP1 and the cooling flow paths FP3 to communicate with each other is provided between an edge of the outer wall 122b in the +X direction and the outer wall 122c. Similarly, a space enabling the outflow path FP2 and the cooling flow paths FP3 to communicate with each other is provided between an edge of the outer wall 122b in the −X direction and the outer wall 122d. That is, the cooling pipe 120A is a hollow cuboid having an opening communicated with the inflow path FP1 and an opening communicated with the outflow path FP2.

The cooling pipe 120A also has the partitions 124c extending in the X direction and arrayed in the Y direction. Each of the partitions 124c is a wall substantially parallel to the X-Z plane and is connected to the outer walls 122a, 122b, 122c, and 122d. Each of the partitions 124c may be connected to one of the outer walls 122a and 122b, the outer wall 122c, and the outer wall 122d. The space in the cooling pipe 120A is divided by the partitions 124c into the cooling flow paths FP3. In the cooling pipe 120A, the inner surface IFa of the outer wall 122a on which the semiconductor module 200 is arranged is a part of the wall surfaces of the cooling flow paths FP3.

The transport pipe 130Ai has outer walls 132ai and 132bi substantially parallel to the X-Y plane, outer walls 132ci and 132di substantially parallel to the Y-Z plane, and outer walls 132ei and 132fi substantially parallel to the X-Z plane. A space enabling the inflow path FP1 to communicate with the cooling flow paths FP3 is provided between an edge of the outer wall 132ai in the −X direction and the outer wall 132di. The supply port Hi penetrating through the outer wall 132ei is formed on the outer wall 132ei. That is, the transport pipe 130Ai is a hollow cuboid having an opening communicated with the cooling flow paths FP3, and the supply port Hi.

The transport pipe 130Ao has outer walls 132ao and 132bo substantially parallel to the X-Y plane, outer walls 132co and 132do substantially parallel to the Y-Z plane, and outer walls 132eo and 132fo substantially parallel to the X-Z plane. A space enabling the outflow path FP2 to communicate with the cooling flow paths FP3 is provided between an edge of the outer wall 132ao in the +X direction and the outer wall 132do. The discharge port Ho penetrating through the outer wall 132eo is formed on the outer wall 132eo. That is, the transport pipe 130Ao is a hollow cuboid having an opening communicating with the cooling flow paths FP3, and the discharge port Ho.

The cooling pipe 120A is connected to the outer walls 132ai and 132di of the transport pipe 130Ai, and the outer walls 132ao and 132do of the transport pipe 130Ao. Accordingly, each of the cooling flow paths FP3 causes the inflow path FP1 and the outflow path FP2 to communicate with each other in the X direction. In the present modification, the cooling flow paths FP3 are positioned between the inflow path FP1 and the outflow path FP2, and the outer wall 122a in the Z direction.

The shapes of the cooling pipe 120A, the transport pipe 130Ai, and the transport pipe 130Ao are not limited to the cuboids extending in the Y direction. The shapes of the transport pipes 130Ai and 130Ao in plan view from the −Y direction may be shapes having curved lines. Similarly, the shape of the cooling pipe 120A in plan view from the −Y direction may be a shape having curved lines.

The outer wall 132bi of the transport pipe 130Ai may be formed integrally with the outer wall 132bo of the transport pipe 130Ao. In this case, the transport pipes 130Ai and 130Ao may have a common partition (for example, the same partition as the partition 124a illustrated in FIG. 3) that separates the inflow path FP1 and the outflow path FP2 from each other, instead of the outer walls 132di and 132do.

The present modification also can achieve effects substantially the same as those of the embodiments described above. Since the header portion 140 is not provided in the present modification, the size of the cooler 100A in the Y direction is reduced.

B2: Second Modification

Although the case in which the cooling flow paths FP3 are positioned between the inflow path FP1 and the outflow path FP2, and the outer wall 122a in the Z direction is illustrated in the modification described above, the present invention is not limited to this mode. For example, the outer wall 122a including the inner surface IFa being a part of the wall surfaces of the cooling flow paths FP3 may be positioned between the outer walls 132ai and 132bi of the transport pipe 130Ai in the Z direction.

Figure 8:
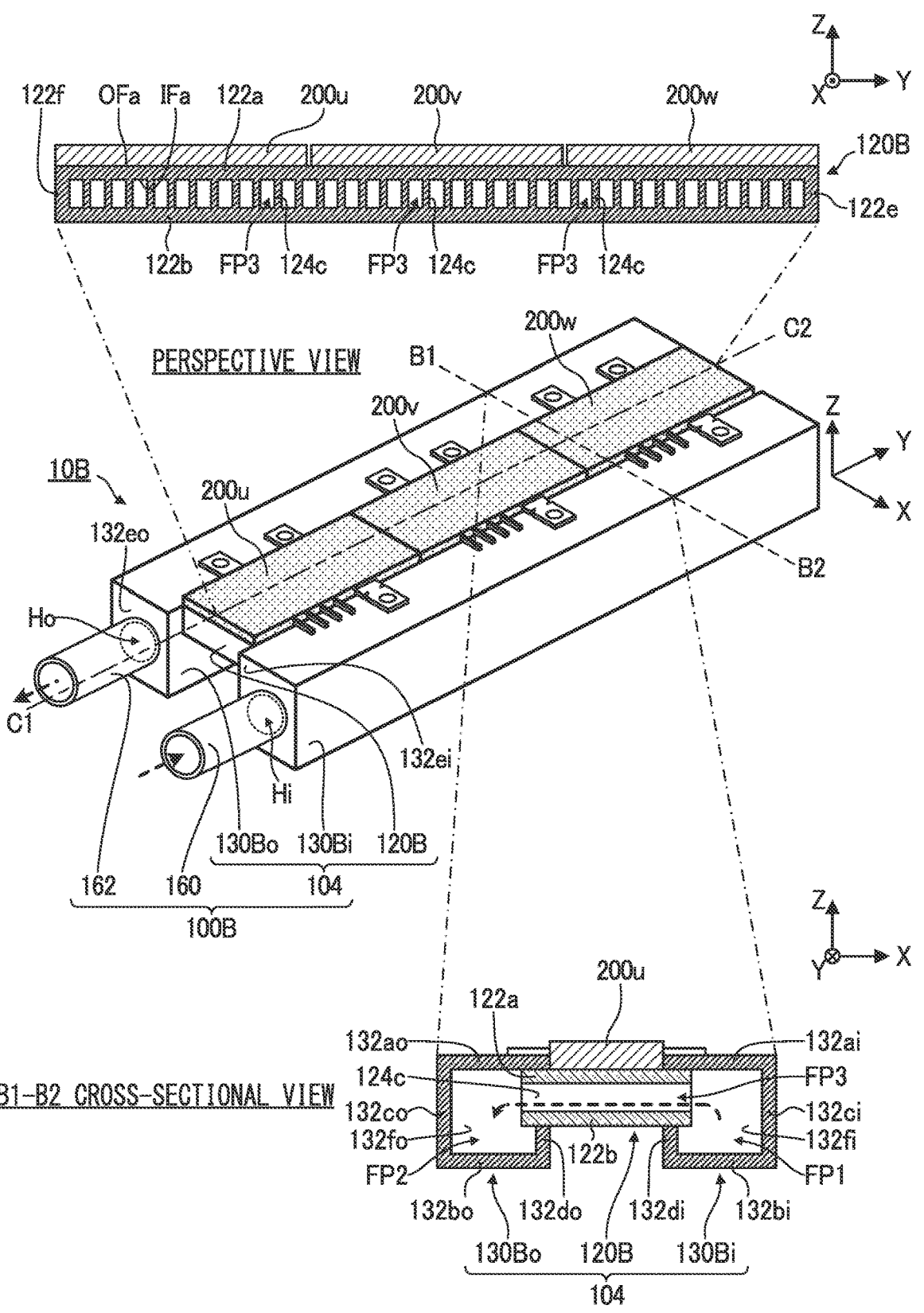
FIG. 8 is an explanatory diagram for an example of a power converter according to a second modification.

FIG. 8 is an explanatory diagram for an example of a power converter 10B according to a second modification. FIG. 8 includes a perspective view of the power converter 10B, and a cross-sectional view thereof taken along line B1-B2. FIG. 8 further includes a cross-sectional view of a cooling pipe 120B and the semiconductor module 200 taken along line C1-C2. Dashed arrows in FIG. 8 indicate the flow of the refrigerant. Elements substantially the same as the elements described in FIGS. 1 to 7 are denoted by like reference signs and detailed explanations thereof are omitted.

The power converter 10B has the three semiconductor modules 200u, 200v, and 200w, and a cooler 100B that cools the semiconductor modules 200u, 200v, and 200w. The cooler 100B has a main body 104 extending in the Y direction, the supply pipe 160, and the discharge pipe 162. The power converter 10B is another example of the "semiconductor apparatus," and the main body 104 is another example of the "cooling main body."

The main body 104 has the cooling pipe 120B including the cooling flow paths FP3 arrayed in the Y direction and extending in the X direction, a transport pipe 130Bi including the inflow path FP1 extending in the Y direction, and a transport pipe 130Bo including the outflow path FP2 extending in the Y direction. The positional relation among the cooling pipe 120B, the transport pipe 130Bi, and the transport pipe 130Bo in the main body 104 is different from the positional relation among the cooling pipe 120A, the transport pipe 130Ai, and the transport pipe 130Ao illustrated in FIG. 7.

The cooling pipe 120B is, for example, a hollow cuboid open in the +Y direction and the −Y direction. In one example, the cooling pipe 120B has the outer walls 122a and 122b substantially parallel to the X-Y plane, and the outer walls 122e and 122f substantially parallel to the X-Z plane. The cooling pipe 120B also has the partitions 124c extending in the X direction and arrayed in the Y direction. Each of the partitions 124c is, for example, a wall substantially parallel to the X-Z plane and is connected to the outer walls 122*a* and 122*b*. Each of the partitions 124*c* may be connected to only one of the outer walls 122*a* and 122*b*. The space in the cooling pipe 120B is divided into the cooling flow paths FP3 by the partitions 124*c*. In the cooling pipe 120B, the inner surface IFa of the outer wall 122*a* on which the semiconductor module 200 is arranged is a part of the wall surfaces of the cooling flow paths FP3.

The transport pipe 130Bi has the outer walls 132*ai* and 132*bi* substantially parallel to the X-Y plane, the outer walls 132*ci* and 132*di* substantially parallel to the Y-Z plane, and the outer walls 132*ei* and 132*fi* substantially parallel to the X-Z plane. An opening through which an edge of the cooling pipe 120B in the +X direction is inserted is formed on the outer wall 132*di*. Inserting the edge of the cooling pipe 120B in the +X direction into the opening of the outer wall 132*di* enables the inflow path FP1 to communicate with the cooling flow paths FP3. The supply port Hi penetrating through the outer wall 132*ei* is formed on the outer wall 132*ei*. That is, the transport pipe 130Bi is a hollow cuboid having an opening communicated with the cooling flow paths FP3, and the supply port Hi.

The transport pipe 130Bo has the outer walls 132*ao* and 132*bo* substantially parallel to the X-Y plane, the outer walls 132*co* and 132*do* substantially parallel to the Y-Z plane, and the outer walls 132*eo* and 132*fo* substantially parallel to the X-Z plane. An opening through which an edge of the cooling pipe 120B in the −X direction is inserted is formed on the outer wall 132*do*. Inserting the edge of the cooling pipe 120B in the −X direction into the opening of the outer wall 132*do* enables the outflow path FP2 to communicate with the cooling flow paths FP3. The discharge port Ho penetrating through the outer wall 132*eo* is formed on the outer wall 132*eo*. That is, the transport pipe 130Bo is a hollow cuboid having an opening communicated with the cooling flow paths FP3, and the discharge port Ho.

The cooling pipe 120B is connected to the transport pipe 130Bi in a state in which the edge in the +X direction is inserted through the opening of the outer wall 132*di* of the transport pipe 130Bi, and is connected to the transport pipe 130Bo in a state in which the edge in the −X direction is inserted through the opening of the outer wall 132*do* of the transport pipe 130Bo. Accordingly, each of the cooling flow paths FP3 causes the inflow path FP1 and the outflow path FP2 to communicate with each other in the X direction. In this modification, the cooling flow paths FP3 are positioned between the outer walls 132*ai* and 132*bi* that define the inflow path FP1 in the Z direction. That is, the cooling flow paths FP3 overlap with the inflow path FP1 in plan view from the +X direction in the present modification.

The shapes of the cooling pipe 120B, the transport pipe 130Bi, and the transport pipe 130Bo are not limited to the cuboids extending in the Y direction. The shapes of the transport pipes 130Bi and 130Bo in plan view from the −Y direction may be shapes having curved lines. Similarly, the shape of the cooling pipe 120B in plan view from the −Y direction may be a shape having curved lines.

In this way, this modification can achieve effects substantially the same as those of the embodiments except for the effects obtained by provision of the space in the −Z direction of the terminals of the semiconductor module 200 (for example, the effect of easy connection of lines and the similar parts to the terminals of the semiconductor module 200).

B3: Third Modification

Each of the cooling flow paths FP3 is communicated with the inflow path FP1 at one end and is communicated with the outflow path FP2 at the other end is illustrated in the embodiments and the modifications, but the present invention is not limited to this mode. Each of the cooling flow paths FP3 may communicate with the inflow path FP1 near an intermediate portion between the inner surface IFc of the outer wall 122*c* and the surface SFb1 of the partition 124*b*. Each cooling flow path FP3 may communicate with the outflow path FP2 near an intermediate portion between the inner surface IFd of the outer wall 122*d* and the surface SFb2 of the partition 124*b* in the X direction. The present modification also can achieve effects substantially the same as those of the embodiments and the modifications described above.

Description of Reference Signs

10, 10A, 10B, 10Z . . . power converter, 100, 100A, 100B, 100Z . . . cooler, 102, 104, 120 . . . main body, 110*i*, 110*o* . . . multi-hole pipe, 112*i*, 112*o*, 122, 122*a*, 122*b*, 122*c*, 122*d*, 122*e*, 122*ea*, 122*eb*, 132*a*, 132*ai*, 132*ao*, 132*bi*, 132*bo*, 132*ci*, 132*co*, 132*di*, 132*do*, 132*ei*, 132*eo*, 142Z, 142*a*, 142*c*, 142*e*, 142*f* . . . outer wall, 114*i*, 114*o*, 124*a*, 124*b*, 124*c*, 144, 144Z . . . partition, 120A, 120B . . . cooling pipe, 130Ai, 130Ao, 130Bi, 130Bo . . . transport pipe, 140, 140Z, 150 . . . header portion, 160 . . . supply pipe, 162 . . . discharge pipe, 200*u*, 200*v*, 200*w* . . . semiconductor module, 202*u*, 202*v*, 202*w*, 204*u*, 204*v*, 204*w* . . . input terminal, 206*u*, 206*v*, 206*w* . . . output terminal, 208*u*, 208*v*, 208*w* . . . control terminal, 300 . . . capacitor, 400 . . . control substrate, 500 . . . casing, 520 . . . input connector, 540 . . . output connector, FP1 . . . inflow path, FP2 . . . outflow path, FP3, FPi, FPo . . . cooling flow path, Hi . . . supply port, Ho . . . discharge port, IFa, IFb, IFb1, IFb2, IFc, IFd . . . inner surface, OFa . . . outer surface, SFa1, SFa2, SFa3, SFb1, SFb2 . . . surface, SP, SPi, SPo . . . space.

What is claimed is:

1. A cooler comprising:
a cooling main body extending in a first direction and including outer walls, the cooling main body including:
   a cooling wall among the outer walls, the cooling wall including a first surface on which a heat generator is to be arranged, and a second surface on an opposite side to the first surface, the cooling wall being between at least two of the outer walls;
   a first flow path extending in the first direction, and having an end into which a refrigerant flows;
   a second flow path extending in the first direction, and having an end from which the refrigerant flows out;
   a plurality of cooling flow paths having the second surface as a part of a wall surface; and
   at least one third partition extending in a second direction intersecting with the first direction and separating adjacent ones of the cooling flow paths, wherein:
the plurality of cooling flow paths are arrayed in the first direction,
the plurality of cooling flow paths extend in the second direction,
the plurality of cooling flow paths are positioned between the first and second flow paths and the cooling wall in a third direction perpendicular to the first surface,
each of the plurality of cooling flow paths includes a first end and a second end, and causes the first flow path and the second flow path to communicate with each other in the second direction,
the at least one third partition is unitary with one of the outer walls of the cooling main body, and

the one of the outer walls of the cooling main body
defines at least one of the first end or the second end
of the each of the plurality of cooling flow paths,
wherein the cooling wall being perpendicular to and
extending between a first inner surface of a first outer
wall among the outer walls defining the first flow
path and a second inner surface of a second outer
wall among the outer walls defining the second flow
path, the first inner surface being parallel to the
second inner surface; and
a header portion coupled to the cooling main body,
wherein a width of the header portion is greater than a
width of the cooling main body.
2. The cooler according to claim 1, wherein
the cooling main body includes:
a first partition:
arranged to be spaced from the cooling wall in the
third direction;
separating the first flow path from the cooling flow
paths; and
separating the second flow path from the cooling
flow paths, and
a second partition separating the first flow path and the
second flow path from each other, wherein the at
least one third partition is arranged between the first
partition and the cooling wall.
3. The cooler according to claim 2,
wherein the at least one third partition is connected to only
one of the first partition and the cooling wall.
4. The cooler according to claim 2,
wherein the at least one third partition is connected to both
the first partition and the cooling wall.
5. A cooler comprising:
a cooling main body extending in a first direction and
including outer walls, the cooling main body including:
a cooling wall among the outer walls, the cooling wall
including a first surface on which a heat generator is
to be arranged, and a second surface on an opposite
side to the first surface, the cooling wall being
between at least two of the outer walls,
a first flow path extending in the first direction, and
having an end into which a refrigerant flows;
a second flow path extending in the first direction, and
having an end from which the refrigerant flows out;
a plurality of cooling flow paths having the second
surface as a part of a wall surface; and
at least one third partition extending in a second
direction intersecting with the first direction and
separating adjacent ones of the cooling flow paths,
wherein:
the plurality of cooling flow paths are arrayed in the
first direction,
the plurality of cooling flow paths extend in the second
direction,
each of the cooling flow paths includes a first end and
a second end, and causes the first flow path and the
second flow path to communicate with each other in
the second direction,
the at least one third partition is unitary with one of the
outer walls of the cooling main body, and
the one of the outer walls of the cooling main body
defines at least one of the first end or the second end
of the each of the plurality of cooling flow paths,
wherein the cooling wall being perpendicular to and
extending between a first inner surface of a first outer
wall among the outer walls defining the first flow
path and a second inner surface of a second outer wall among the outer walls defining the second flow
path, the first inner surface being parallel to the
second inner surface; and
a header portion coupled to the cooling main body,
wherein a width of the header portion is greater than a
width of the cooling main body.
6. A semiconductor apparatus comprising:
a cooler including a cooling main body extending in a first
direction and including outer walls, the cooling main
body including:
a cooling wall among the outer walls, the cooling wall
including a first surface on which a heat generator is
to be arranged, and a second surface on an opposite
side to the first surface, the cooling wall being
between at least two of the outer walls;
a first flow path extending in the first direction, and
having an end into which a refrigerant flows;
a second flow path extending in the first direction, and
having an end from which the refrigerant flows out;
a plurality of cooling flow paths having the second
surface as a part of a wall surface; and
at least one third partition extending in a second
direction intersecting with the first direction and
separating adjacent ones of the cooling flow paths,
wherein:
the plurality of cooling flow paths are arrayed in the
first direction,
the plurality of cooling flow paths extend in the second
direction,
the plurality of cooling flow paths are positioned
between the first and second flow paths and the
cooling wall in a third direction perpendicular to the
first surface,
each of the plurality of cooling flow paths includes a
first end and a second end, and causes the first flow
path and the second flow path to communicate with
each other in the second direction,
the at least one third partition is unitary with one of the
outer walls of the cooling main body, and
the one of the outer walls of the cooling main body
defines at least one of the first end or the second end
of the each of the plurality of cooling flow paths,
wherein the cooling wall being perpendicular to and
extending between a first inner surface of a first outer
wall among the outer walls defining the first flow
path and a second inner surface of a second outer
wall among the outer walls defining the second flow
path, the first inner surface being parallel to the
second inner surface; and
a header portion coupled to the cooling main body,
wherein a width of the header portion is greater than
a width of the cooling main body.
7. A semiconductor apparatus comprising:
a cooler including a cooling main body extending in a first
direction and outer walls, the cooling main body
including:
a cooling wall among the outer walls, the cooling wall
including a first surface on which a heat generator is
to be arranged, and a second surface on an opposite
side to the first surface, the cooling wall being
between at least two of the outer walls;
a first flow path extending in the first direction, and
having an end into which a refrigerant flows;
a second flow path extending in the first direction, and
having an end from which the refrigerant flows out;
a plurality of cooling flow paths having the second
surface as a part of a wall surface; and at least one third partition extending in a second
direction intersecting with the first direction and
separating adjacent ones of the cooling flow paths,
wherein:

the plurality of cooling flow paths are arrayed in the
first direction, the plurality of cooling flow paths extend in the second
direction, and each of the cooling flow paths includes a first end and
a second end, and causes the first flow path and the
second flow path to communicate with each other in
the second direction, the at least one third partition is unitary with one of the
outer walls of the cooling main body, and the one of the outer walls of the cooling main body
defines at least one of the first end or the second end
of the each of the plurality of cooling flow paths,
wherein the cooling wall being perpendicular to and
extending between a first inner surface of a first outer
wall among the outer walls defining the first flow
path and a second inner surface of a second outer
wall among the outer walls defining the second flow
path, the first inner surface being parallel to the
second inner surface; and a header portion coupled to the cooling main body,
wherein a width of the header portion is greater than
a width of the cooling main body.

\* \* \* \* \*